US010111199B2

(12) United States Patent
Larson et al.

(10) Patent No.: US 10,111,199 B2
(45) Date of Patent: Oct. 23, 2018

(54) INFORMATION TECHNOLOGY (IT) EQUIPMENT POSITIONING SYSTEM

(71) Applicants: Thane M. Larson, Roseville, CA (US); Christopher G. Malone, Loomis, CA (US); Stephen B. Lyle, Granite Bay, CA (US)

(72) Inventors: Thane M. Larson, Roseville, CA (US); Christopher G. Malone, Loomis, CA (US); Stephen B. Lyle, Granite Bay, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 45 days.

(21) Appl. No.: 14/886,644

(22) Filed: Oct. 19, 2015

(65) Prior Publication Data

US 2016/0044629 A1  Feb. 11, 2016

Related U.S. Application Data

(63) Continuation of application No. 11/046,633, filed on Jan. 28, 2005, now Pat. No. 9,182,480.

(51) Int. Cl.
| | |
|---|---|
| G08B 5/22 | (2006.01) |
| H04W 64/00 | (2009.01) |
| G01S 13/75 | (2006.01) |
| G01S 13/82 | (2006.01) |
| G06K 7/10 | (2006.01) |

(52) U.S. Cl.
CPC ......... *H04W 64/003* (2013.01); *G01S 13/751* (2013.01); *G01S 13/825* (2013.01); *G06K 7/10366* (2013.01)

(58) Field of Classification Search
CPC . G01S 13/751; G01S 13/825; G06K 7/10366; H04W 64/003
USPC .......................................................... 340/8.1
See application file for complete search history.

(56) References Cited

U.S. PATENT DOCUMENTS

| | | | | |
|---|---|---|---|---|
| 3,754,596 | A | * | 8/1973 | Ward, Jr. ................ F28D 15/00 165/104.34 |
| 5,548,816 | A | | 8/1996 | DeVaney |
| 5,887,176 | A | | 3/1999 | Griffith et al. |
| 6,067,046 | A | | 5/2000 | Nichols |

(Continued)

FOREIGN PATENT DOCUMENTS

| | | |
|---|---|---|
| CA | 2321009 | 9/2000 |
| EP | 1357512 A2 | 10/2003 |

(Continued)

OTHER PUBLICATIONS

Martin Cooper; Marc Goldberg, Ph. D. Intelligent Antennas: Spatial Division Multiple Access, 1996 Annual Review of Communications, pp. 999-1002.

(Continued)

*Primary Examiner* — Naomi J Small
(74) *Attorney, Agent, or Firm* — Koestner Bertani LLP (57) ABSTRACT

An information technology (IT) equipment positioning system comprises a plurality of wireless transponders distributed in multiple locations in the data center and a controller. The controller is adapted to operate the transponders using triangulation to identify and detect positioning according to three-dimensional coordinates for wireless-tagged IT equipment located in the data center.

18 Claims, 7 Drawing Sheets

(56) References Cited

U.S. PATENT DOCUMENTS

| | | |
|---|---|---|
| 6,324,266 B1 | 11/2001 | Mannings |
| 6,392,544 B1 | 5/2002 | Collins et al. |
| 6,649,403 B1 | 11/2003 | McDevitt et al. |
| 6,713,298 B2 | 3/2004 | McDevitt et al. |
| 6,975,959 B2 | 12/2005 | Dietrich et al. |
| 7,165,412 B1* | 1/2007 | Bean, Jr. ............... F25B 25/00 62/259.2 |
| 7,252,230 B1 | 8/2007 | Sheikh et al. |
| 7,290,000 B2 | 10/2007 | Meifu et al. |
| 7,627,091 B2 | 12/2009 | Becker et al. |
| 2001/0038354 A1* | 11/2001 | Gilboa ............... F41G 3/225 342/450 |
| 2002/0070862 A1* | 6/2002 | Francis ............... G06K 17/00 340/572.1 |
| 2002/0095487 A1 | 7/2002 | Day et al. |
| 2002/0160363 A1 | 10/2002 | McDevitt et al. |
| 2002/0197622 A1 | 12/2002 | McDevitt et al. |
| 2003/0008671 A1 | 1/2003 | Lundgren et al. |
| 2003/0036425 A1 | 2/2003 | Kaminkow et al. |
| 2003/0046339 A1* | 3/2003 | Ip ............... H04L 41/12 709/203 |
| 2003/0064422 A1 | 4/2003 | McDevitt et al. |
| 2003/0093187 A1 | 5/2003 | Walker |
| 2003/0095032 A1 | 5/2003 | Hoshino et al. |
| 2003/0102367 A1 | 6/2003 | Monette et al. |
| 2003/0135476 A1* | 7/2003 | Holland ............... G06Q 10/04 706/47 |
| 2003/0186228 A1 | 10/2003 | McDevitt et al. |
| 2004/0008113 A1* | 1/2004 | Pradhan ............... G01S 5/0289 340/539.26 |
| 2004/0015309 A1* | 1/2004 | Swisher ............... H04L 41/0813 702/79 |
| 2004/0015418 A1 | 1/2004 | Dooley et al. |
| 2004/0053322 A1 | 3/2004 | McDevitt et al. |
| 2004/0148762 A1* | 8/2004 | Eschenweck ...... H05K 13/0084 29/593 |
| 2004/0230866 A1 | 11/2004 | Yates et al. |
| 2004/0257766 A1* | 12/2004 | Rasmussen et al. ..... H05K 7/20 361/689 |
| 2005/0046584 A1 | 3/2005 | Breed |
| 2005/0140507 A1 | 6/2005 | Nam et al. |
| 2006/0022802 A1 | 2/2006 | Bridgelall |
| 2006/0026316 A1 | 2/2006 | Milenkovic et al. |
| 2006/0028352 A1 | 2/2006 | McNamara et al. |
| 2006/0043174 A1 | 3/2006 | Banavar et al. |

FOREIGN PATENT DOCUMENTS

| | | |
|---|---|---|
| FR | 2800186 | 10/1999 |
| GB | 2329301 | 3/1999 |
| GB | 2366939 | 3/2002 |
| JP | 2000357251 A | 12/2000 |
| JP | 2001513891 A | 9/2001 |
| JP | 2004292147 | 3/2003 |
| JP | 2003524531 A | 8/2003 |
| JP | 2003533704 A | 11/2003 |
| JP | 2004323135 A | 11/2004 |
| JP | 2005004756 A | 1/2005 |
| JP | 2005005704 A | 1/2005 |
| WO | WO-9801772 A2 | 1/1998 |
| WO | 2000/77536 | 12/2000 |
| WO | 2001/82009 A2 | 11/2001 |
| WO | 2001/92910 | 12/2001 |
| WO | 2005/121832 | 12/2005 |

OTHER PUBLICATIONS

Arraycomm, Inc., iBurst Broadband Wireless System Overview, Oct. 2004, San Jose, CA. www.arraycomm.com.

RFID Journal, Thin-Film Battery May Energize RFID, Oct. 18, 2002.

Arraycomm, Incorporated, "IntelliCell: A Fully Adaptive Approach to Smart Antennas,," 2002, pp. 1-18, ArrayComm.

Jeff Lindsay et al., "Retail RFID Systems without Smart Shelves," Nov. 7, 2003, pp. 1-11, JeffLindsay.com,.

Office Action, GB Application No. 0601519.2, dated Apr. 29, 2009, pp. 1-7, IPO UK.

Power Paper LTD., "Power Paper Advantage," 2003, pp. 1-2.

Siemens, "Transforming Production with Tiny Transponders," Pictures of the Future Fall 2008, Oct. 31, 2002, pp. 1-7, Siemens AG.

* cited by examiner

FIG. 7

INFORMATION TECHNOLOGY (IT) EQUIPMENT POSITIONING SYSTEM

PRIORITY INFORMATION

This application is a continuation of, and claims priority to U.S. application Ser. No. 11/046,633 filed on Jan. 28, 2005, the contents of which are incorporated herein by reference in its entirety.

BACKGROUND OF THE INVENTION

Resource management involves awareness and monitoring of resources in a dynamic environment. Location is one component of awareness.

A data center may be considered a collection of many types of resources, often highly valuable resources. Data center resources are not limited simply to various types of electronic equipment, but also data and information resources which can potentially have a value exceeding that of the physical assets.

Data center personnel address a growing challenge in management of multiple systems and other information technology equipment in a large data center. Information technology (IT) equipment may be redeployed or physically moved without the knowledge of data center management personnel, presenting difficulty in locating the equipment for repair and upgrade. Difficulties are especially prevalent for data centers in remote offices and unmanned sites.

SUMMARY

In accordance with an embodiment of a system for usage in a data center, an information technology (IT) equipment positioning system comprises a plurality of wireless transponders distributed in multiple locations in the data center and a controller. The controller is adapted to operate the transponders using triangulation to identify and detect positioning according to three-dimensional coordinates for wireless-tagged IT equipment located in the data center.

BRIEF DESCRIPTION OF THE DRAWINGS

Embodiments of the invention relating to both structure and method of operation may best be understood by referring to the following description and accompanying drawings.

DETAILED DESCRIPTION

An illustrative resource management system for usage in a data center context is configured to track information technology (IT) equipment with electronic tags using wireless technologies to identify location and size of the equipment. In a particular embodiment, radio frequency identification (RFID) and Global Positioning System (GPS) technologies may be used to track IT assets.

Some embodiments may combine wireless tracking of location and equipment size with asset labeling using Telcordia™ command line interface (CLI) codes, thereby increasing functionality.

Figure 1:
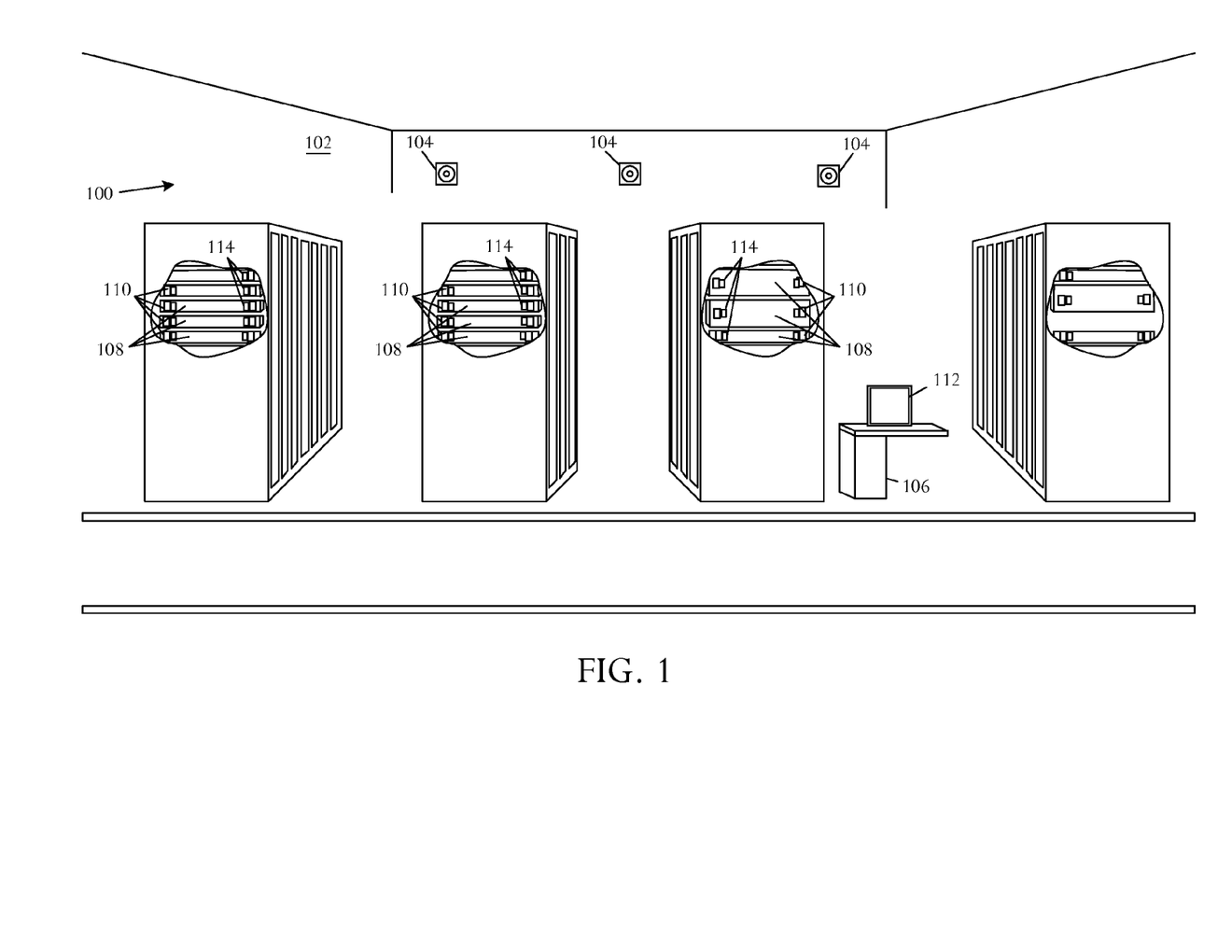
FIG. 1 is a schematic pictorial diagram illustrating an embodiment of an information technology (IT) equipment positioning system for usage in a data center.

Referring to FIG. 1, a schematic pictorial diagram illustrates an embodiment of an information technology (IT) equipment positioning system 100 for usage in a data center 102 that comprises a plurality of wireless transponders 104 distributed in multiple locations in the data center 102 and a controller 106. The controller 106 is adapted to operate the transponders 104 using triangulation to identify and detect positioning according to three-dimensional coordinates for wireless-tagged IT equipment 108 located in the data center 102.

A typical system embodiment includes at least three wireless transponders 104 which are distributed at locations in the data center 102 sufficient to use triangulation for determining three-dimensional coordinates of the IT equipment 108. Generally, suitable transponder locations are separated by an appropriate amount to enable triangulation and are positioned to cover all or a suitable portion of the data center 102.

The RFID triangulation system functions based on the principle of known global positioning system (GPS) technology except that the RFID system operates internal to the data center 102. The RFID triangulation system has transponders 104 including multiple antennas, operating as transmitters, receivers, or combined transmitter-receivers positioned in appropriate locations throughout the data center 102. An IT equipment item 108 that is to be tracked and monitored has an affixed RFID tag which radiates a signal. The signal is detected by multiple receiving antennas. The individual antennas have known positions, enabling computation of the distance between the various antennas and the tag. The position at which the various computed radii intersect is the triangulated location of the tag.

Some complexity in the RFID triangulation system results from limited signal-to-noise performance of the RFID tags and transponders. Larger antennas may be implemented to improve performance. Triangulation signal processing techniques may be used to address multiple-path difficulties. Signal processing techniques may be used to distinguish main line-of-sight signals from superfluous reflected multiple path signals. Some configurations may use multiple antennas positioned throughout the data center to create additional opportunities to detect transmitted signals and determine tag locations.

Wireless tagging of IT equipment 108 enables resource tracking according to conditions detected using position and asset inventory monitoring. Continuous location monitoring enables a current resource mapping to be maintained throughout the data center even for resources which are moved without authorization or knowledge. Resource monitoring enables tracking of failed resources and resources for which replacement is warranted.

The IT equipment 108 may encode spatial dimension information as part of a wireless tag 110. The controller 106 can be configured to access the spatial dimension information and map the information along with location information. For example, the controller 106 may detect the volume-space occupied by wireless-tagged IT equipment 108 and map the volume-space in a three-dimensional descriptive mapping of the data center 102.

Various other types of information in addition to size and spatial dimension information may be read using the tags. For example, the tag may include information such as product numbers, serial numbers, and other system-specific information. The tag 110 may be in the form of a field replaceable unit (FRU), enabling encoded information to be selected according to characteristics of the particular asset and usage conditions.

The various items of information technology (IT) equipment 108 may include, for example, servers, host computers, storage arrays, storage controllers, or any of a myriad of different types of electronic equipment for usage in a data center 102. One or more wireless tags 110 are attached to the IT equipment items 108. A storage 114, such as a memory, is connected to and associated with the wireless tag 110 and includes a data structure field that characterizes physical dimensions of the IT equipment item 108.

More than one wireless tag may be attached to the IT equipment 108. The controller 106 may be further adapted to detect orientation of IT equipment 108 outfitted with multiple tags and located within the data center 102. The controller 106 detects orientation, also by triangulation, based on detection of two or more wireless tags which are attached to the IT equipment 108 at locations separated sufficiently to enable discernment of orientation.

In some embodiments, the system 100 further comprises a graphical user interface 112. The controller 106 may be configured to manage the graphical user interface 112 to display a mapping describing the current data center configuration and positioning of IT equipment 108 within the data center 102. The controller 106 may also be configured manage the graphical user interface 112 and generate a real-time display of inventory, location mapping, and size description of IT equipment 108 within the data center 102.

Figure 2:
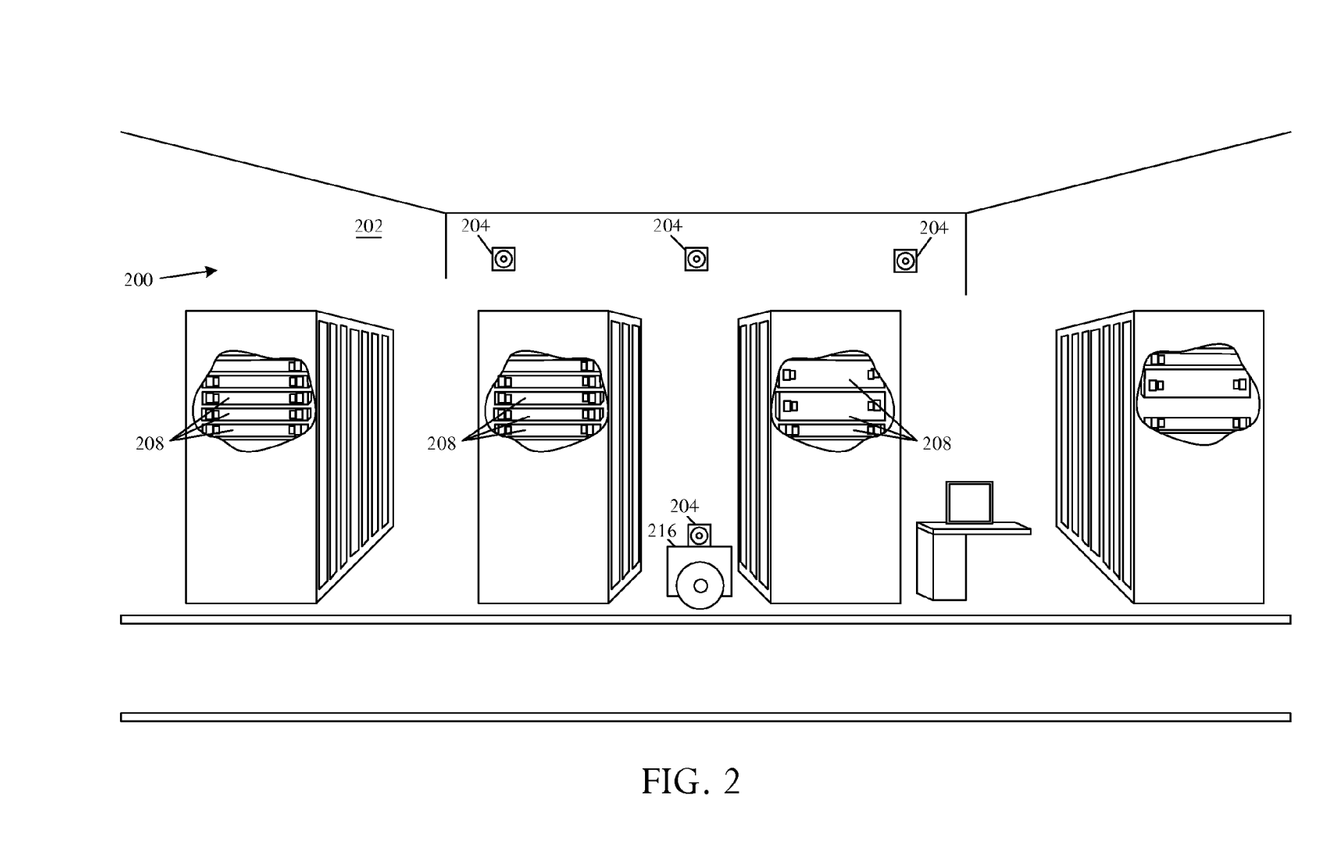
FIG. 2 is a schematic pictorial diagram depicting an embodiment of an information technology (IT) equipment positioning system including a transponder mounted on a robot.

Referring to FIG. 2, a schematic pictorial diagram illustrates an embodiment of an information technology (IT) equipment positioning system 200 for usage in a data center 202 that further comprises a robot 216. The robot 216 operates in conjunction with a plurality of wireless transponders 204 to monitor and map information technology (IT) equipment 208. One or more robots 216 are adapted to carry at least one wireless transponder 204, patrol the data center 202, and determine positioning of the IT equipment 208. The robot 216 can patrol hallways of the data center 202 so that a transponder reader 204 is positioned in close proximity to the tags during patrolling. The robot 216 tracks position during movement so that location of the IT equipment item is known. A typical robot 216 is a goal-oriented robot controlled to patrol a particular region. The robot 216 implements awareness of location and can energize tags and report information, overcoming some of the signal-to-noise complexities of triangulation systems.

Figure 3:
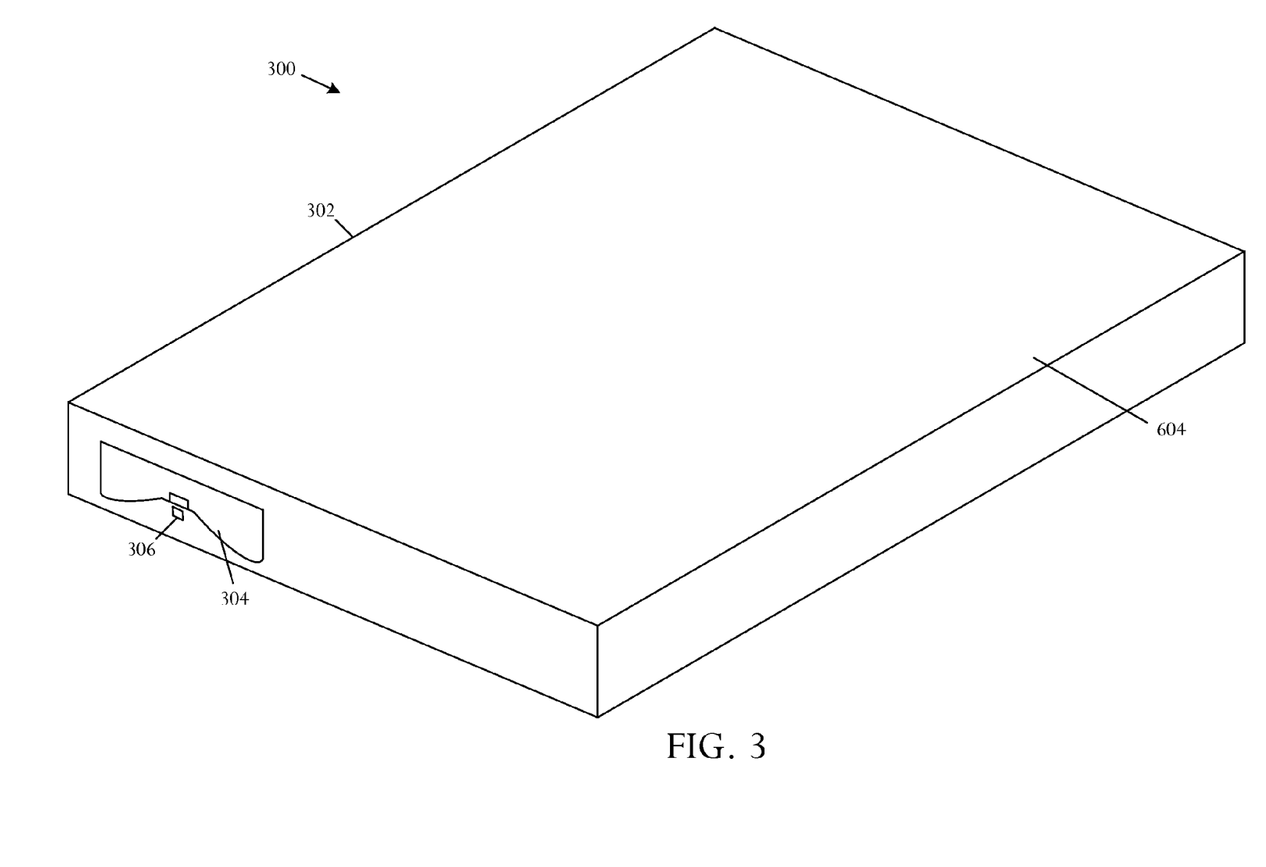
FIG. 3 is a schematic block diagram showing an embodiment of a radio frequency identification (RFID)-enabled electronic device.

Referring to FIG. 3, a schematic block diagram illustrates an embodiment of a radio frequency identification (RFID)-enabled electronic device 300 comprising an item of information technology (IT) equipment 302 and at least one radio frequency identifier (RFID) 304. A storage 306 is coupled to the RFID 304 and includes a data structure field characterizing physical dimensions of the IT equipment item 302.

In various embodiments, the RFID 304 may be a passive RFID. In a passive RFID system, an antenna is used to transmit a radio signal to the RFID tag, which generates a signal that interferes with the antenna-transmitted radio signal in a known manner and reflects a modified signal back to the antenna. The passive RTID tag may be associated with data, typically a small amount of data. In an illustrative embodiment, the data may encode information characterizing the spatial dimensions and/or size of the chassis, housing, or packaging of an information technology (IT) equipment item. A passive RFID does not include a power source or battery so that operation and performance depends on signal-to-noise ratio concepts. Read distance of a passive RTID is limited, for example from a range of several centimeters to two or three meters, so that telemetry range of the transponders is typically short or transponder antennas very large.

Passive RFID tags may also be implemented in a system that replaces fixed low-range readers with long-range readers with directional antennas that sweep an area to identify objects based on an RFID code. Highly-sensitive electronics may be used to resolve faint signals at longer distances. Advanced antennas with filtering systems that separate an RFID signal from background noise may be used to read from passive RFID tags at longer distances.

In some embodiments, "Smart Antennas" may be used to facilitate triangulation. Smart antennas are adaptive antenna arrays including multiple antennas cooperatively associated with processors that continually readjust radio frequency signals from each of the antennas to create systems with precise directionality and a capability to greatly amplify detected signals. Smart antennas amplify weak signals and determine the direction of a radio signal source. Further information concerning smart antenna systems is disclosed by Martin Cooper and Marc Goulberg in "Intelligent Antennas: Spatial Division Multiple Access," 1996 *Annual Review of Communications*, pp. 999-1002 (www.arraycom.com/Company/spatial_division.pdf) and in various papers available at www.arraycom.com/Company/white_papers.html.

RFID tags can be read by multiple readers at different locations and triangulation performed based on the arrival time of the signal to determine the location of the RFID tag.

In other embodiments, the RFID 304 may be an active RFID. An active RFID tag generally includes a power source and data is transmitted by the active RFID tag at either a selected rate or upon activation by an antenna in a transponder. An active RFID enables transmission at longer distances with a smaller transponder antenna. Usage of active RFID tags enables higher read ranges. Low-cost batteries that are printable on paper or film, for example available from PowerPaper of Einat, Israel (www.PowerPaper.com) or from Cymbet Corporation of Elk River, Minn., described in "Thin-film Battery May Energize RFID," *RFID Journal*, Oct. 18, 2002 (www.rfidjournal.com/article/view/94) facilitate usage of active RFID tags. Active RFID tags enable higher frequency ranges, for example in a range of about 2.5 to 24 gigahertz (GHz), or higher in the future. (See "Transforming Production with Tiny Transponders," Tim Schroder, *Siemens Webzine*, Oct. 31, 2002, at w4.siemens.de/Ful/en/archive/pof/heft2_02/artike105/). Ultra-low power electronics can be used in transponders to enable long distance transmission and extra-high frequency, battery-operated transponders with very long range, as high as several kilometers. The electronics further facilitate triangulation by enabling measurement of distances between a reader and transponder to accuracy in a range of 1 centimeter. Precise location of a transponder is performed by processing run-time data from multiple readers. The extra-high frequency technology enables transponders to be tracked even in conditions of GPS failure including interior to buildings or in canyons between tall buildings.

In one example of a location system that implements active RFID tags, a transponder locating system can be used to detect presence and location of the tags. The triangulation system may be arranged as a matrix of locating transponders that are installed at a suitable spacing within the data center. The locating transponders are managed to determine locations of the RFID tags. A database is continuously updated with current tag locations as frequently as is warranted by possible resource movement.

In some embodiments the RFID 304, either active or passive, may be connected to and associated with a storage which includes a data structure field that embeds at least one command line interface (CLI) code. Telcordia CLI codes for the telecommunications industry can be used in a technique by which a geographical location is assigned to a resource. The CLI codes are conventionally entered manually into a data system. CLI codes are subsequently accessed to determine billing on communications packets that travel through multiple regions, sites, and equipment, generally allocated to a particular enterprise or company. The system illustrated herein enables automated assignment of CLI codes to resources within a system.

Telcordia™ CLI codes enable flexible description of resource location. Location can be described as explicitly as a particular coordinate within a room or building, or as broadly as a system in a country.

Some implementations use multiple radio frequency identifiers (RFIDs) 304 arranged on the IT equipment item 302 so that orientation of the IT equipment 302 item can be determined by triangulation. For example, two RFID tags 304 may be mounted onto opposing corners of a server chassis and the location of each corner can be determined by triangulation. The two RFID tags are encoded with different identification data, enabling the location information determined for the tags to be correlated and thus orientation to be determined.

Figure 4A:
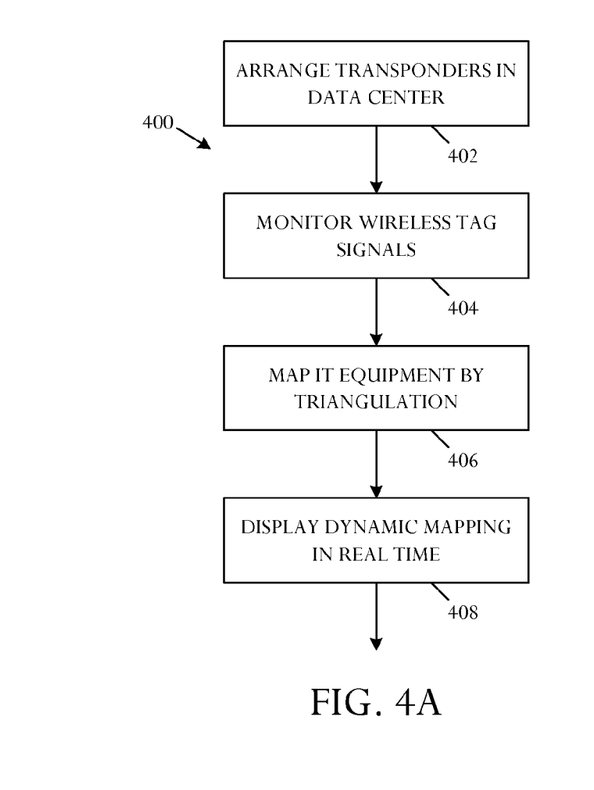
FIGS. 4A and 4B are flow charts illustrating embodiments of methods for mapping information technology (IT) equipment in a data center.

Referring to FIG. 4A, a flow chart illustrates an embodiment of a method 400 for mapping information technology (IT) equipment in a data center. Actions of the method 400 comprise arranging 402 three or more transponders in the data center and monitoring 404 wireless tag signals for tags coupled to and associated with IT equipment within the data center. Information technology (IT) equipment locations are mapped 406 by triangulation of the monitored wireless tag signals. A real-time dynamic location mapping may be displayed 408 which describes the current IT equipment configuration in the data center. The display may be in the form of a full, three-dimensional block diagram of the data center.

Figure 4B:
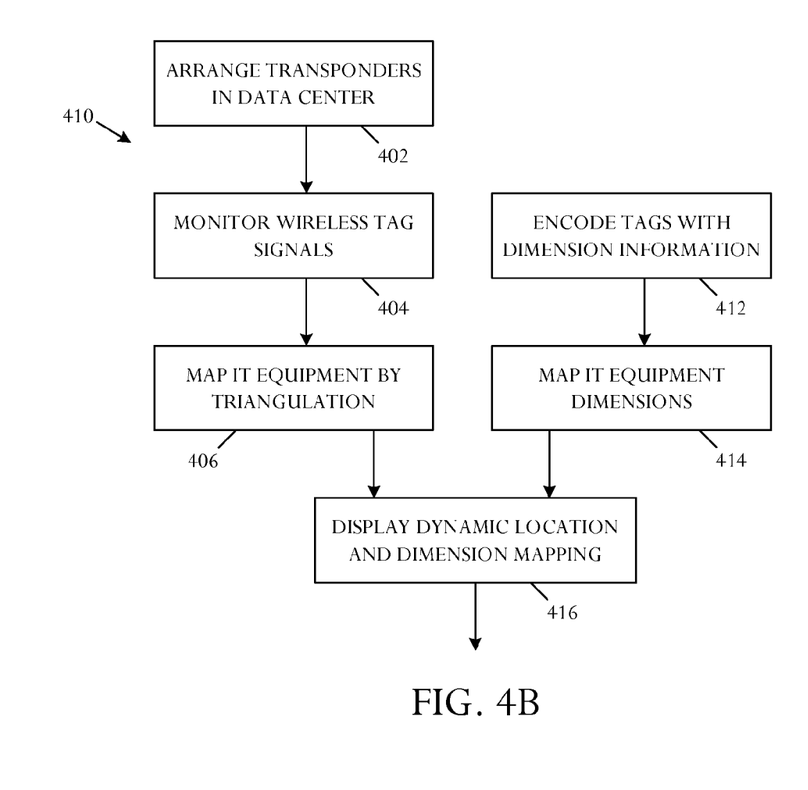

In some embodiments 410, for example as shown in FIG. 4B, wireless tags can be encoded 412 with information characterizing spatial package dimensions of the IT equipment. The transponders can monitor not only to determine the location of IT equipment, but also to acquire the spatial dimension tag information. Mapping 414 may be performed to map the monitored IT equipment dimensions in addition to IT equipment location. The real-time dynamic location and spatial dimension mapping may be displayed 416, describing a current configuration of IT equipment in the data center.

Also in some implementations, the wireless tags may encode command line interface (CLI) codes associated with data center IT equipment. The transponders may be used to read the CLI codes.

The various functions, processes, methods, and operations performed or executed by the system can be implemented as programs that are executable on various types of processors, controllers, central processing units, microprocessors, digital signal processors, state machines, programmable logic arrays, and the like. The programs can be stored on any computer-readable medium for use by or in connection with any computer-related system or method. A computer-readable medium is an electronic, magnetic, optical, or other physical device or means that can contain or store a computer program for use by or in connection with a computer-related system, method, process, or procedure. Programs can be embodied in a computer-readable medium for use by or in connection with an instruction execution system, device, component, element, or apparatus, such as a system based on a computer or processor, or other system that can fetch instructions from an instruction memory or storage of any appropriate type. A computer-readable medium can be any structure, device, component, product, or other means that can store, communicate, propagate, or transport the program for use by or in connection with the instruction execution system, apparatus, or device.

The illustrative block diagrams and flow charts depict process steps or blocks that may represent modules, segments, or portions of code that include one or more executable instructions for implementing specific logical functions or steps in the process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

Figure 5:
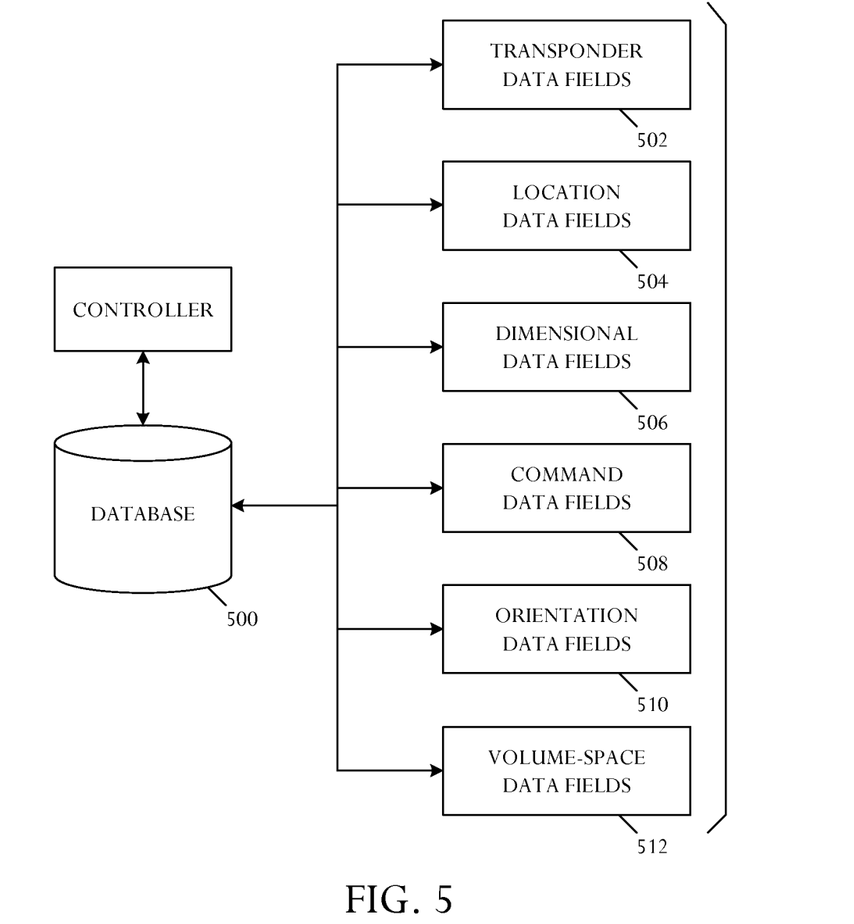
FIG. 5 is a schematic data structure diagram depicting an embodiment of a database which can be used to store data relating to information technology (IT) equipment in a data center.

Referring to FIG. 5, a schematic data structure diagram illustrates an embodiment of a database 500 stored on a computer-readable medium which can be used to store data relating to information technology (IT) equipment in a data center. The database 500 comprises a plurality of data fields configured to map the data center in a three-dimensional space. The data fields include transponder data fields 502 adapted for usage with the transponders in a wireless communication system that uses triangulation to determine three-dimensional position coordinates for wireless-tagged information technology (IT) equipment positioned in the data center. The data fields further include location data fields 504 adapted to identify location of the IT equipment within the data center determined by triangulation. Spatial dimensional data fields 506 may also be included which are adapted to identify spatial dimensions of the IT equipment within the data center encoded in a wireless tag on the IT equipment.

Command data fields 508 may be included to store one or more command line interface (CLI) codes which may be encoded in a wireless tag on the IT equipment and read using transponders.

Some embodiments may also include orientation data fields 510 adapted to store orientation information determined using triangulation of two or more wireless tags on information technology (IT) equipment.

Volume-space data fields 512 may be included and identify volume of the IT equipment within the data center encoded in a wireless tag on the IT equipment.

Figure 6:
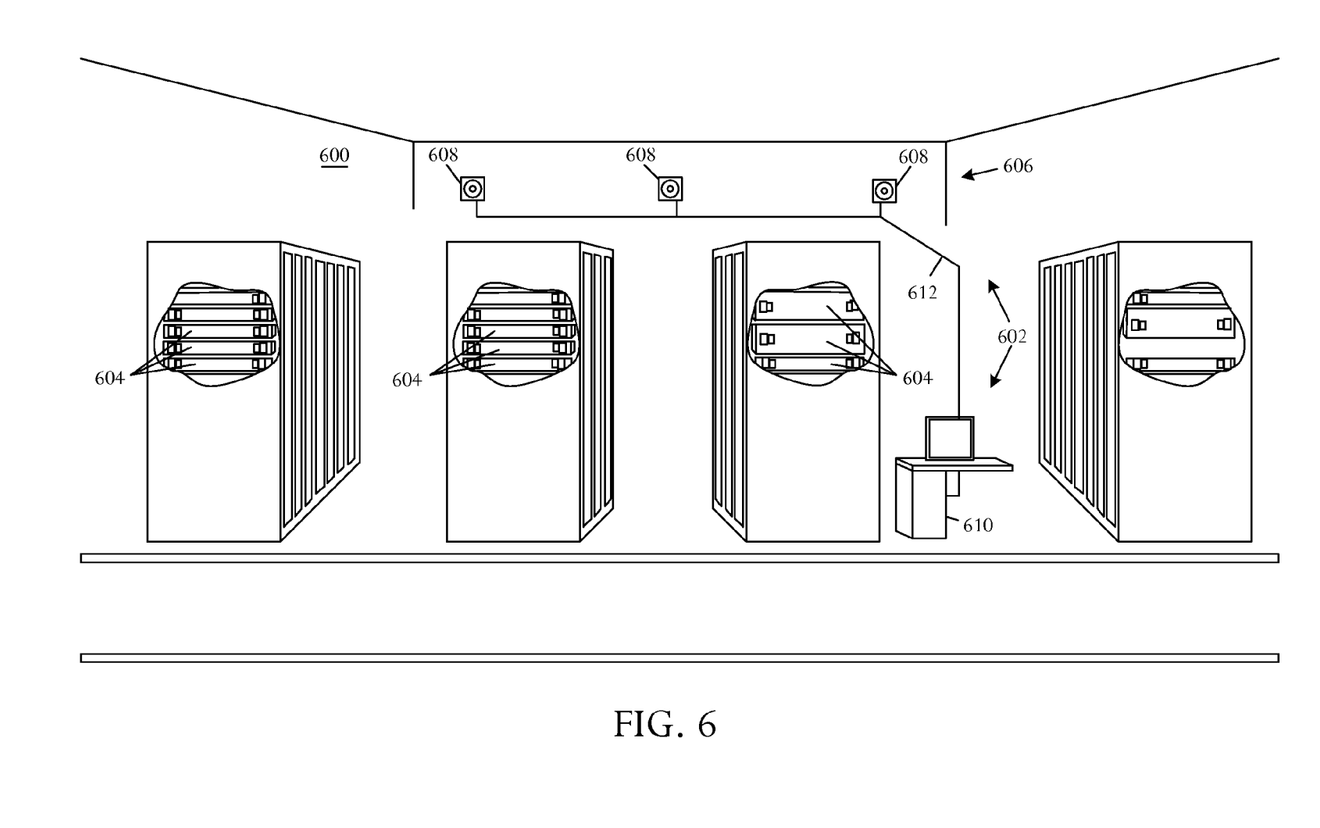
FIG. 6 is a schematic pictorial diagram illustrating a perspective view of a data center that implements an illustrative resource monitoring system adapted to map information technology (IT) equipment.

Referring to FIG. 6, a schematic pictorial diagram illustrates a perspective view of a data center 600 that implements an illustrative resource monitoring system 602 adapted to map information technology (IT) equipment 604. The IT equipment may include, for example, one or more servers, and may be monitored using information encoded in field replaceable units (FRUs) and wireless positioning. A wireless communication system 606, for example implementing radio frequency identifier (RFID) and global positioning system (GPS) technology, includes three or more transponders 608 distributed in suitable locations in the data center 600.

The wireless communication system 606 may use triangulation to determine an accurate set of x, y, and z-coordinates describing the position of IT equipment 604 in the data center 600. The resource monitoring system 602 may include a management application 610 which manages the various types of information. The management application 610 includes manageability agents and manageability software to transmit coordinates in combination with information encoded in a field replaceable unit (FRU) electronically-erasable programmable read-only memory (EEPROM) to the central management application or utility 610.

The management utility 610 can be used to automatically generate a full map of the data center 600 in real time.

In a particular embodiment, the transponders 608 may be interconnected using local area network (LAN) connections 612. A substantial amount of system processing power can be implemented in the LAN connection 612 and the transponders 608, enabling "dumb" implementations of IT equipment 604 to be tracked by the central management utility 610.

A suitable management utility 610 may be used. For example, Openview™ and System Insight Manager™ for Integrity™ servers both made available by Hewlett-Packard Company of Palo Alto, Calif. may be implemented to handle the information. Openview™ automates change and configuration management of software across any computing device or platform to accelerate service delivery, reduce operation costs, and improve service. Openview™ enables information technology managers to address business priorities through increased visibility and control of client software. System Insight Manager™ performs hardware fault, asset, and configuration management for Hewlett-Packard systems and servers including delivery of rapid deployment and performance management, and workload and partition management. System Insight Manager™ can be extended with management for clients, storage, printers and power products, and can manage various platforms through industry standard management protocols.

High-level applications such as Openview™, System Insight Manager™, or similar packages may be used to coordinate thermal monitoring and/or control operations for a very large number, for example tens, hundreds, or more, servers, devices, and components. The high-level application can aggregate information while enabling monitoring of particular elements, for example addressed as a particular server in a specific rack. The high-level application may also perform various operations such as load balancing, analysis of ventilation in the vicinity of a rack, and control of CRAC and venting of perforated tiles.

The resource monitoring system 602 enables automated control and management, improving accuracy over manual logging methods which are currently used. The resource monitoring system 602 reduces or minimizes human intervention, thereby reducing or eliminating mistakes.

The management utility 610 may use the resource location information determined by monitoring tags on the IT equipment 604 and the resource spatial dimension information also accessed from the tags, to manage the IT equipment 604 in the data center 600. The management utility 610 may use the location and/or size information in combination with other monitored parameters to allocate resources according to various considerations such as system cooling, airflow, workload efficiency, and the like. The management utility 610 monitors the location and size of IT equipment, and may further monitor operations of the equipment, taking into consideration capacity and capabilities of the equipment.

The management utility 610 may detect conditions, such as temperature and airflow conditions, for which repositioning of IT equipment items may improve performance. For example, a particular IT equipment item may perform for optimally in a higher airflow condition. The management utility 610 may detect the location of the item and determine that the location is in a low-airflow portion of the data center 600. The utility 610 may generate a notification message, for example via a graphical user interface, informing of a better resource configuration. The management utility 610 may further determine the position of vacant cabinet or rack locations to which IT equipment resources may be moved to improve performance.

The management utility 610 can use spatial dimension information encoded in the wireless tags to enable mapping of available slots in racks and cabinets, as well as occupied slots. The management utility 610 can map each IT equipment item in a cabinet and determine the number of occupied slots in the rack. A database accessible to the management utility 610 may store information relating to the capacity of the individual racks in the data center 600, which can be compared to the map of occupied slots to determine slot space left available for equipment which may subsequently be added. In a typical configuration, equipment is commonly a constant width and depth so that the encoded size information describes the height in U units. The management utility 610 tracks the IT equipment in three dimensions so that the height of IT equipment items and the height of vacant slots can be mapped.

The management utility 610 can use the dimensional information to generate an automated three-dimensional picture of resources. The Telcordia™ Command Line Interface (CLI) codes can be used to supplement the resource picture.

In some embodiments, the racks or cabinets may also be tagged, for example to describe capacity, enabling the data center database to automatically update when new racks are installed.

Figure 7:
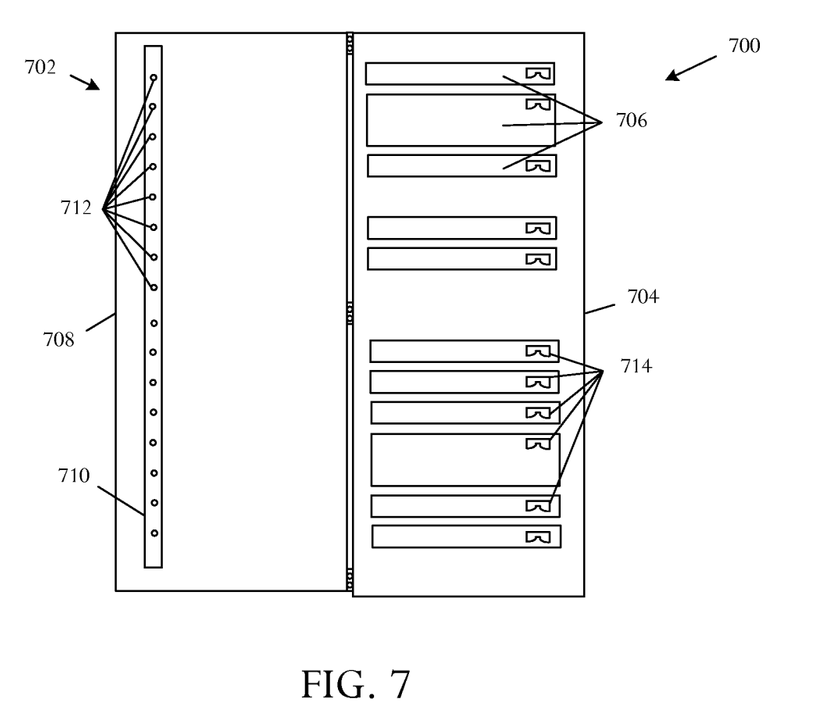
FIG. 7 is a schematic pictorial diagram showing an embodiment of a resource mapping system including a transponder system implemented in a data center rack.

Referring to FIG. 7, a schematic pictorial diagram illustrates an embodiment of a resource mapping system 700 including a transponder system 702 constructed of a rack 704 adapted to hold multiple IT equipment items 706. The rack 704 has a door 708. An extended length printed circuit board 710 is mounted on the rack door 708. Multiple sensors 712 are aligned and arranged on the printed circuit board 710, for example with a regular spacing. Some embodiments may have sensors mounted differently and arranged in other patterns.

One or more wireless tags 714, for example radio frequency identification (RFID) tags, are attached to the IT equipment items 706. In the illustrative arrangement, the RFID tags are intentionally implemented with limited sensitivity over long distances because the sensors 712 have a close spacing and the tags are intended to activate only the limited sensors 712 at close range. The illustrative sensor configuration is capable of determining position of the IT equipment items but cannot effectively determine IT equipment item size because only a single tag is mounted on the equipment item. Accordingly, in the illustrative embodiment the tag is embedded with information identifying equipment item size.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, a few specific examples of transponder arrangements and techniques for monitoring are described. The illustrative resource monitoring techniques can be used with any suitable types of sensors and sensed parameters. Although the tag may be termed a radio frequency identification (RFID) tag, but may be based on technology other than radio frequency technology. For example, a tag may be implemented to be read by other technology, such as magnetic, opto-magnetic, optical, or other technology. The sensor technology typically has sensors physically separated from the tags, although in some implementations, the sensors and tags may be in contact. Tags may be passive or active and may be implemented either with or without computing or processing capability. The illustrative techniques may be used with any suitable data center configuration and with any suitable servers, computers, and devices.

What is claimed is:

1. A radio frequency identification (RFID)-enabled electronic device comprising:
    an item of information technology (IT) equipment at a first slot in a first location of a data center,
        wherein the data center comprises a plurality of receivers for receiving RFID signals;
    a RFID tag affixed to the IT equipment item and embedded with size information associated with the IT equipment item; and
    storage coupled to the RFID tag including a data structure field to:
        characterize physical dimensions of the IT equipment item based on the orientation of the RFID tag to determine a current configuration of the data center;
        characterize temperature conditions in the data center;
        determine a position of the IT equipment item at a second slot in a second location of the data center using three-dimensional coordinate triangulation and the plurality of receivers to improve cooling, airflow, and workload efficiency of the datacenter relative to the IT equipment at the first slot, wherein the second location is different than the first location; and
        determine an availability of a third slot in a third location of the data center for the IT equipment item using the three-dimensional coordinate triangulation.
2. The RFID-enabled electronic device of claim 1, wherein the first slot of the data center is included in a rack of the data center.

3. The RFID-enable electronic device of claim 1, wherein the first slot of the data center is included in a cabinet of the data center.

4. The RFID-enabled electronic device of claim 1, wherein the RFID tag comprises an active RFID tag.

5. The RFID-enabled electronic device of claim 1, wherein the RFID tag comprises a passive RFID tag.

6. An information technology (IT) equipment positioning system, comprising:
    wireless transponders distributed in a data center,
        wherein the data center comprises a plurality of receivers for receiving RFID signals; and
    a controller coupled to the wireless transponders to:
        identify a position of wireless-tagged IT equipment at locations corresponding to respective slots located in the data center, wherein the position is identified using three-dimensional coordinate triangulation;
        determine a current condition of the data center, wherein the current condition of the data center includes temperature, airflow, and workload efficiency;
        determine different locations corresponding to different respective slots in the data center to position the IT equipment to improve of cooling, airflow, and workload efficiency performance, wherein the determination is based on the physical dimensions of the IT equipment; and
        determine an availability of a particular slot in a particular location of the data center for an IT equipment item using the three-dimensional triangulation.

7. The system of claim 6, wherein the slots are in racks and/or cabinets located in the datacenter.

8. The system of claim 6, wherein at least two wireless tags are associated with the IT equipment to determine a position that includes three dimensional coordinates of the IT equipment in three dimensional space.

9. The system of claim 6, wherein the controller detects a volume-space occupied by wireless-tagged IT equipment at slots of a rack or cabinet located in the data center according to dimension information encoded in association with a wireless tag of the IT equipment.

10. The system of claim 6, further comprising:
    a graphical user interface; and
    the controller that displays via the graphical user interface a mapping describing a current data center configuration and positioning of IT equipment in the data center.

11. The system of claim 6, wherein the controller detects orientation of wireless-tagged IT equipment at slots of a rack or cabinet located in the data center based on at least two wireless tags attached to the IT equipment.

12. The system of claim 6, further comprising:
    a graphical user interface; and
    the controller displaying via the graphical user interface a real-time inventory, location mapping, and size description of IT equipment in the data center.

13. The system of claim 6, further comprising at least three wireless transponders distributed at locations in the data center sufficient to use triangulation to determine three-dimensional coordinates of the IT equipment.

14. The system of claim 6, further comprising:
    the item of IT equipment mounted at a slot of a rack and/or cabinet of the data center;
    at least one wireless tag coupled to the item of IT equipment mounted in the slot.

15. The system of claim 6, wherein the IT equipment item has affixed to it an RFID tag embedded with size information associated with the IT equipment item.

16. A database stored on a non-transitory computer-readable medium, comprising:
  data fields to map a data center in a three-dimensional space, the data fields including:
    transponder data fields to use with at least three transponders in a wireless communication system that uses triangulation to determine three-dimensional position coordinates of wireless-tagged information technology (IT) equipment positioned in the data center,
      wherein the data center comprises a plurality of receivers for receiving RFID signals;
    location data fields to identify a first location of the IT equipment corresponding to a respective slot in the data center determined by triangulation,
      wherein the IT equipment has affixed to it an RFID tag embedded with size information associated with the IT equipment;
    dimensional data fields to:
      identify spatial dimensions of the IT equipment in the data center based on orientation of wireless tags, wherein the dimensional data fields are used to determine positioning of the IT equipment in a second location corresponding to a different respective slot of the data center to improve performance of the data center, wherein the different respective slot is different relative to the first location based on the orientation of the wireless tags; and
    determine an availability of a third slot in a third location of the data center for the IT equipment using the three-dimensional coordinate triangulation.

17. The database of claim 16, wherein the data fields further include command data fields to store at least one command line interface (CLI) code encoded in a wireless tag on the IT equipment.

18. The database of claim 16, wherein the data fields further include volume-space data fields to identify volume of the IT equipment in the data center encoded in a wireless tag on the IT equipment.

* * * * *